United States Patent
Hsieh et al.

(10) Patent No.: US 10,948,952 B2
(45) Date of Patent: Mar. 16, 2021

(54) POWER DISTRIBUTION BOARD, MODULAR CHASSIS SYSTEM AND OPERATING METHOD THEREOF

(71) Applicant: Wiwynn Corporation, New Taipei (TW)

(72) Inventors: Cheng Kuang Hsieh, New Taipei (TW); Chia Ming Tsai, New Taipei (TW); Chia Hao Hsu, New Taipei (TW)

(73) Assignee: WIWYNN CORPORATION, New Taipei (TW)

( * ) Notice: Subject to any disclaimer, the term of this patent is extended or adjusted under 35 U.S.C. 154(b) by 316 days.

(21) Appl. No.: 16/150,432

(22) Filed: Oct. 3, 2018

(65) Prior Publication Data

US 2019/0339747 A1    Nov. 7, 2019

(30) Foreign Application Priority Data

May 2, 2018    (TW) .................................. 107114821

(51) Int. Cl.
*G06F 1/18*    (2006.01)
*G06F 1/3287*    (2019.01)
(Continued)

(52) U.S. Cl.
CPC .............. *G06F 1/189* (2013.01); *G06F 1/185* (2013.01); *G06F 1/188* (2013.01); *G06F 1/28* (2013.01); *G06F 1/3287* (2013.01)

(58) Field of Classification Search
CPC .......... G06F 1/189; G06F 1/185; G06F 1/188; G06F 1/28; G06F 1/3287
See application file for complete search history.

(56) References Cited

U.S. PATENT DOCUMENTS 9,671,846 B1 *   6/2017  Davis ..................... G06F 1/3206
2008/0028246 A1 * 1/2008  Witham ................ G06F 1/3203
                                          713/330
(Continued)

FOREIGN PATENT DOCUMENTS

CN    101097467 A    1/2008
CN    101989115 A    3/2011
(Continued)

OTHER PUBLICATIONS

China Patent Office, "Office Action", China, dated Jun. 18, 2020.
(Continued)

*Primary Examiner* — Jaweed A Abbaszadeh
*Assistant Examiner* — Gayathri Sampath
(74) *Attorney, Agent, or Firm* — Locke Lord LLP; Tim Tingkang Xia, Esq.

(57) ABSTRACT

A power distribution board for a modular chassis system, wherein the modular chassis system is configured to install a plurality of electrical devices, and the power distribution board comprises: a plurality of detecting pins, a microcontroller and a plurality of protecting circuits. The plurality of detecting pins electrically connects to the plurality of electrical devices respectively, and each detecting pins is configured to detect a modular type of a respective one of the electrical devices. The microcontroller electrically connects to the plurality of the detecting pins and selectively chooses one of a plurality of configurations according to the detected modular type. Each of the protecting circuits electrically connects to the microcontroller and corresponds to one of the electrical devices, each of the protecting circuits set a rated power value according to the chosen one of the configurations.

16 Claims, 3 Drawing Sheets

(51) Int. Cl.
*G06F 1/28* (2006.01)
*H05K 7/20* (2006.01)
*H05K 7/14* (2006.01)
*G06F 1/20* (2006.01)
*G06F 1/30* (2006.01)

(56) References Cited

U.S. PATENT DOCUMENTS

| | | | | |
|---|---|---|---|---|
| 2008/0312888 | A1* | 12/2008 | Vinson | G06F 1/20 703/2 |
| 2009/0056359 | A1* | 3/2009 | Germagian | H05K 7/20836 62/259.2 |
| 2009/0265045 | A1* | 10/2009 | Coxe, III | G06F 1/20 700/300 |
| 2011/0029789 | A1 | 2/2011 | Tsai et al. | |
| 2011/0289327 | A1* | 11/2011 | Nolterieke | G06F 1/26 713/300 |
| 2015/0289209 | A1* | 10/2015 | Fishman | H04W 52/0222 370/311 |

FOREIGN PATENT DOCUMENTS

| | | |
|---|---|---|
| CN | 107179804 A | 9/2017 |
| TW | 201106144 A | 2/2011 |
| TW | 201621663 A | 6/2016 |
| TW | 201729097 A | 8/2017 |

OTHER PUBLICATIONS

Taiwan Patent Office, "Office Action", dated Dec. 6, 2018, Taiwan.

* cited by examiner

POWER DISTRIBUTION BOARD, MODULAR CHASSIS SYSTEM AND OPERATING METHOD THEREOF

CROSS-REFERENCE TO RELATED APPLICATIONS

This non-provisional application claims priority under 35 U.S.C. § 119(a) on Patent Application No(s). 107114821 filed in Taiwan on May 2, 2018, the entire contents of which are hereby incorporated by reference.

TECHNICAL FIELD

This disclosure relates to a modular chassis system, more particularly to a modular chassis system having dynamic power protecting configurations.

RELATED ART

For server systems, providing a reliable service for continuous operation is a competitive advantage that cannot be ignored. High availability is the key to server system solutions. In order to achieve high availability, hardware devices with redundancy function are generally adopted to avoid SPOF (Single Point Of Failure). In conventional IT machine room, a server system constructed by a storage device and a computing device (Server) requires two motherboards to implement a backup mechanism and meet the high availability. However, under the current Hadoop architecture, which is the mainstream application of data centers, the mechanism of data backup has been mostly achieved by a higher level management software. Therefore, the redundancy function provided by the chassis of the conventional storage device and the computing device appears repetitive. In addition, since the motherboards related to both input and output need two copies, not only the hardware costs but also the power consumption increase accordingly, and this is not in line with the development trend of the green energy technology industry.

Integrating storage devices and computing devices into a modular chassis system is expected to decrease unnecessary machine cost and save power consumption.

SUMMARY

According to one or more embodiments of this disclosure, a power distribution board for a modular chassis system, wherein the modular chassis system is configured to install a plurality of electrical devices, and the power distribution board comprises: a plurality of detecting pins configured to electrically connect to the plurality of electrical devices respectively, wherein each of the detecting pins is configured to detect a modular type of a respective one of the electrical devices; a microcontroller electrically connected to the plurality of detecting pins, wherein the microcontroller is configured to selectively choose one of a plurality of configurations according to the detected modular type; and a plurality of protecting circuits electrically connected to the microcontroller and configured to correspond to the plurality of electrical devices, wherein each of the protecting circuits is configured to set a rated power value according to the chosen one of the configurations.

According to one or more embodiments of this disclosure, a modular chassis system for installing a plurality of electrical devices comprising: a power distribution board comprising: a plurality of detecting pins configured to electrically connect to the plurality of electrical devices respectively, wherein each of the detecting pins is configured to detect a modular type of a respective one of the electrical devices; a microcontroller electrically connected to the plurality of detecting pins, wherein the microcontroller is configured to selectively choose one of a plurality of configurations according to the detected modular type; and a plurality of protecting circuits electrically connected to the microcontroller and configured to correspond to the plurality of electrical devices, wherein each of the protecting circuits is configured to set a rated power value according to the chosen one of the configurations; a bus cable electrically connecting to the power distribution board, wherein the bus cable is configured to connect to an external power to provide an electricity to the modular chassis system; and a fan assembly electrically connecting to the microcontroller and having a plurality of fans, wherein each of the fans adjusts a fan speed according to the chosen one of the configurations.

According to one or more embodiments of this disclosure, a method for operating a modular chassis system, wherein the modular chassis system is configured to install a plurality of electrical devices and each of the electrical devices corresponds to a detecting pin and a protecting circuit, and the method comprises: providing a power to boot the modular chassis system by a bus cable; determining a modular type of each of the electrical devices by a microcontroller according to each of the detecting pins; assigning one of a plurality of configurations according to each of the modular types by the microcontroller; assigning a rated power value according to the assigned configuration by each of the protecting circuits; and executing a power monitoring procedure according to the assigned rated power values by the protecting circuits.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
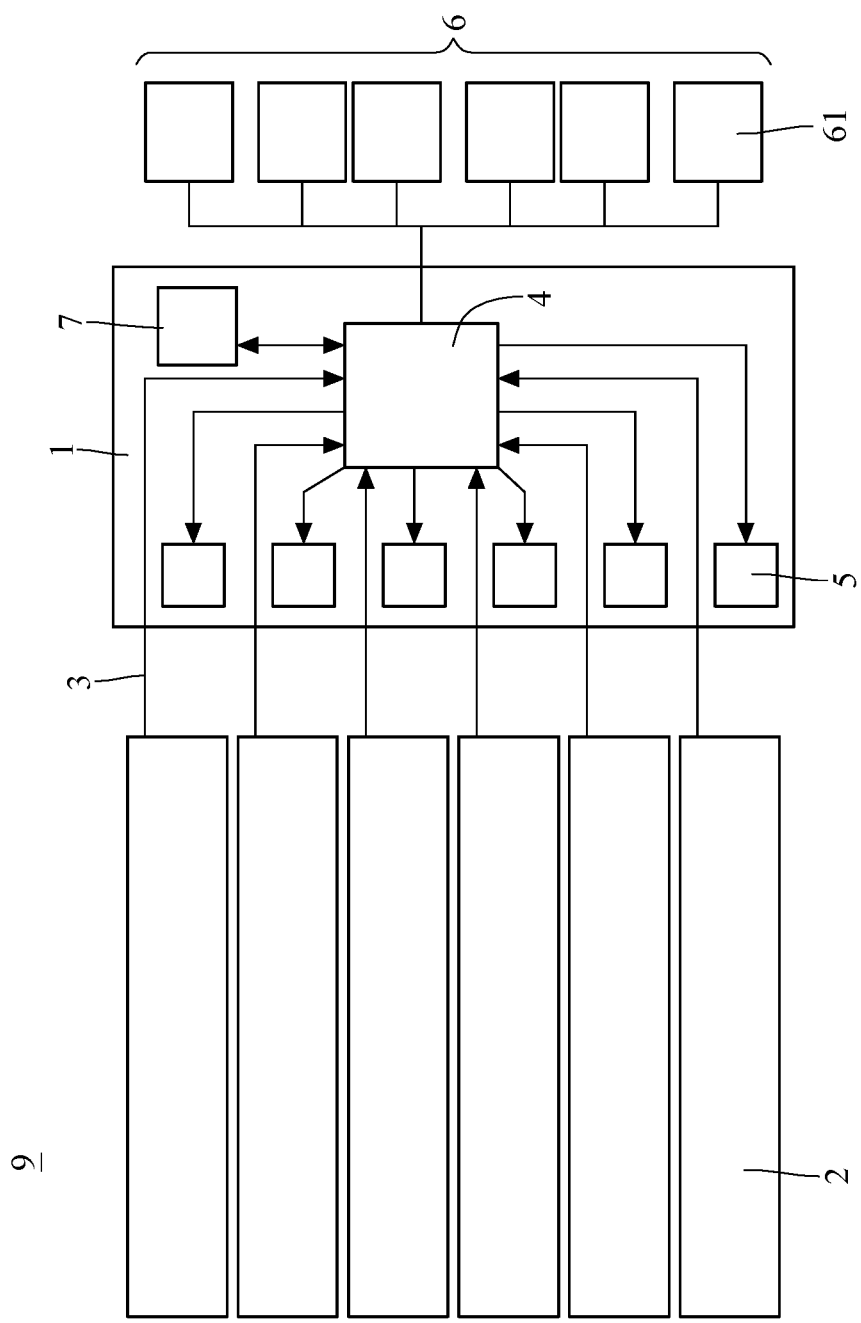
FIG. 1 is a circuit architecture diagram of a modular chassis system according to a power distribution board of the embodiment of the present disclosure.
Figure 2:
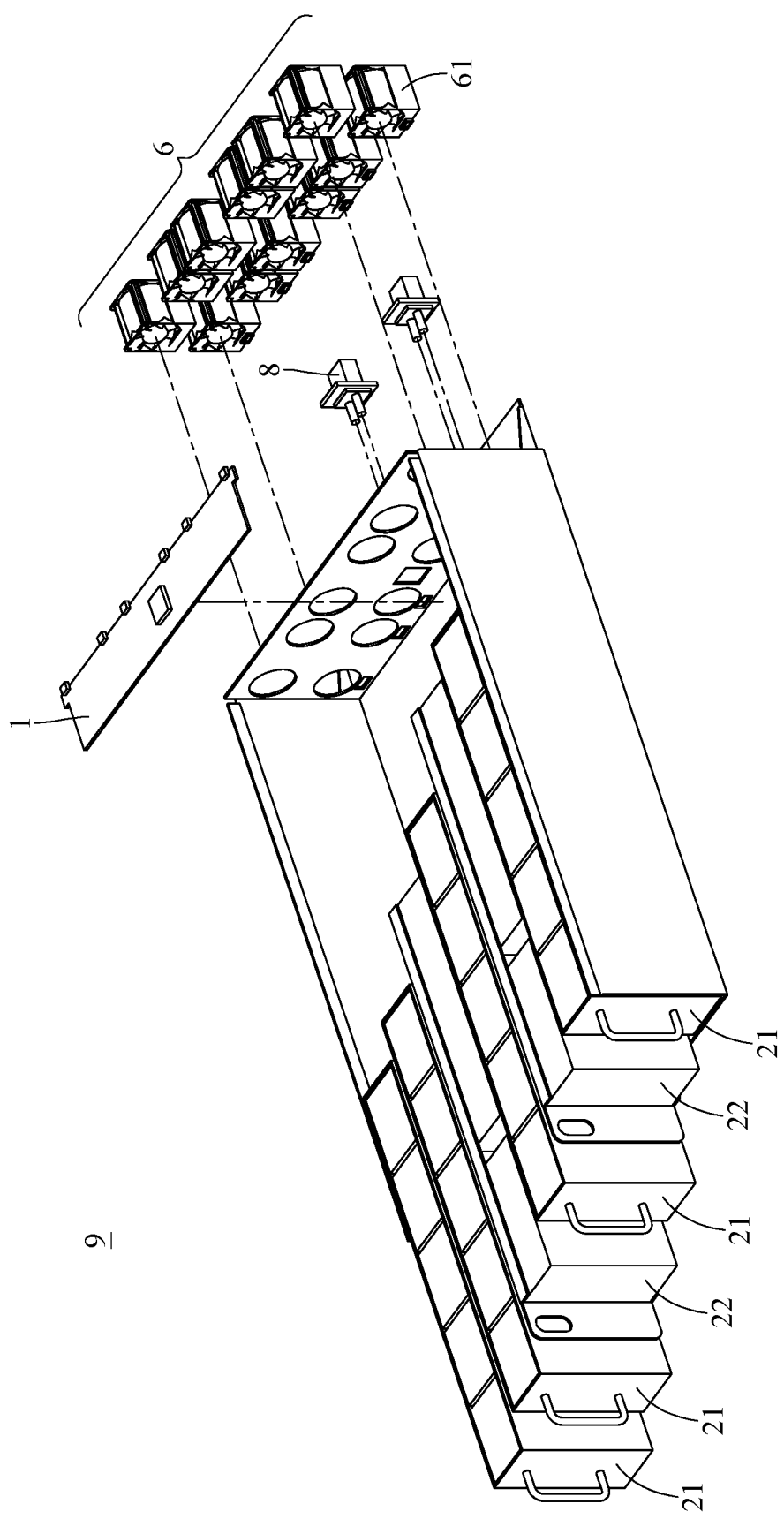
FIG. 2 is a schematic spatial structure of the modular chassis system according to the embodiment of the present disclosure.

Please refer to FIG. 1 and FIG. 2. FIG. 1 illustrates a circuit architecture diagram of a modular chassis system 9 according to a power distribution board 1 of the embodiment of the present disclosure, and FIG. 2 illustrates a schematic spatial structure of the modular chassis system 9 according to the embodiment of the present disclosure. The power distribution board 1 is configured for the modular chassis system 9 shown in FIG. 2, and the modular chassis system 9 is configured to install a plurality of electrical devices 2. The dynamic protection mechanism provided by the power distribution board 1 will be described below, and the modular chassis system 9 to which the power distribution board 1 is applied to instantly adjust the protection settings and fan speed of each electrical device 2 will be described.

Please refer to FIG. 1. The power distribution board 1 of an embodiment according to the present disclosure comprises a plurality of detecting pins 3, a microcontroller 4, a plurality of protecting chips 5 and a storage component 7.

Please refer to FIG. 1. The detecting pins 3 respectively have an electrical connection to the electrical devices 2. In other words, the detecting pins 3 and the electrical devices 2 are in one-to-one correspondence. As shown in FIG. 1, the modular chassis system 9 has six electrical devices 2, therefore the power distribution board 1 has six detecting pins 3. Each of detecting pins 3 is configured to detect the modular type of the electrical devices 2 connected to itself. In practical, the modular type is the kind of the electrical devices 2, such as a storage device, a computing device (server) or other unrecognizable types to the system. However, the present disclosure does not limit the type or the number of the electrical devices 2.

Please refer to FIG. 1. The microcontroller 4 electrically connects to all detecting pins 3. The microcontroller 4 is configured to selectively assign one of the configurations according to the modular type detected by the detecting pins 3. Specifically, the plurality of configurations comprises the first configuration, the second configuration, and the third configuration. The first configuration corresponds to the aforementioned storage devices, the second configuration corresponds to the aforementioned computing devices and the third configuration corresponds to the electrical devices 2 that the system cannot recognize. Therefore, the microcontroller 4 may assign different setting parameters in each configuration according to different modular types.

Please refer to FIG. 1. All the plurality of protecting chips 5 electrically connect to the microcontroller 4, and are configured to correspond to the plurality of electrical devices 2 respectively. In other words, the protecting chips 5 and the electrical devices 2 are also in one-to-one correspondence. Each protecting chip 5 is configured to assign its own rated electric value according to the configuration set by the microcontroller 4, in this embodiment, the rated electric value is just rated current value for providing the configuration of OCP (Over Current Protection). However, the rated electric value may also be rated voltage value or rated power value, which is not limited in the present disclosure. In general, the rated current of the storage device is higher than the rated current of the computing device. So the rated current value assigned by the first configuration is greater than the rated current value assigned by the second configuration.

Please refer to FIG. 1. The storage component 7 is configured to store the correspondence between each modular type and each configuration, such as the following table

| Modular Type | Storage device | Computing device | Other electrical devices |
|---|---|---|---|
| Configuration | First configuration | Second configuration | Third configuration |
| Rated Current Value | 100 A (Ampere) | 30 A | 150 A |

In practical, the storage component 7 is, for example, the ROM (Read-Only Memory) or EEPROM (Electrically-Erasable Programmable Read-Only Memory). In addition, the storage component 7 may be further configured to store another corresponding relation of each of the modular types and a fan calibration curve. The fan calibration curve is used by the system to control different fan speed according to the electrical devices 2 of different modular types.

In the power distribution board 1 according to another embodiment of the present disclosure, the microcontroller 4 further comprises a storage space configured to store a corresponding relation of each of the modular types and each of the configurations. In other words, the content originally stored in the storage component 7 can be stored in the storage space of the microcontroller 4 when the amount of data occupied by the modular type and configuration is not large, thereby saving the cost of additional ROM or EEPROM.

Please refer to FIG. 2. The modular chassis system 9 according to an embodiment of the present disclosure is configured to install a plurality of electrical devices 2, said modular chassis system 9 comprises: the power distribution board 1 just mentioned before, and a fan assembly 6 and a bus cable 8.

As previous described, the power distribution board 1 is configured to detect the modular type of each electrical device 2, then the power distribution board 1 respectively assign the rated current value of the protecting chips 5 corresponding to the electrical device 2 according to the detected modular type.

Please refer to FIG. 2, the modular type of the electrical device 2 includes the storage device 21 and the computing device 22 as listed in the table above. The storage device 21 is, for example, an HDD (Hard Disk Drive HDD) or an SSD (Solid-State Disk). The computing device 22 is, for example, a server, a display card, or an acceleration cards that comprises FPGA (Field Programmable Gate Array) and GPU (Graphics Processing Unit). The electrical device 2 is installed pluggably in the modular chassis system 9 through a drawer type. Since the electrical device 2 in each drawer type chassis can be arbitrarily configured, there are 64 ($2^6$) ways to configure electrical devices 2 of the modular chassis system 9 shown in FIG. 2.

Please refer to FIG. 2. The fan assembly 6 electrically connects to the microcontroller 4 on the power distribution board 1. The fan assembly 6 comprises a plurality of groups of fans 61. Each group of fans 61 corresponds to an electrical device 2, and adjusts its own rotation speed according to the configuration assigned by the microcontroller 4. Specifically, the storage component 7 on the power distribution board 1 can store the correspondence between each modular type and the fan calibration curve, and each fan 61 adjusts its own rotation speed according to the fan calibration curve. In other words, the rotational speed of each of the fans 61 is determined in accordance with the type of the module of the electrical device 2, like the manner of setting the rated current value for the protecting chips 5.

Please refer to FIG. 2. The bus cable 8 electrically connects to the power distribution board 1, wherein the bus cable 8 is configured to connect to an external power to supply the power to the modular chassis system 9.

Figure 3:
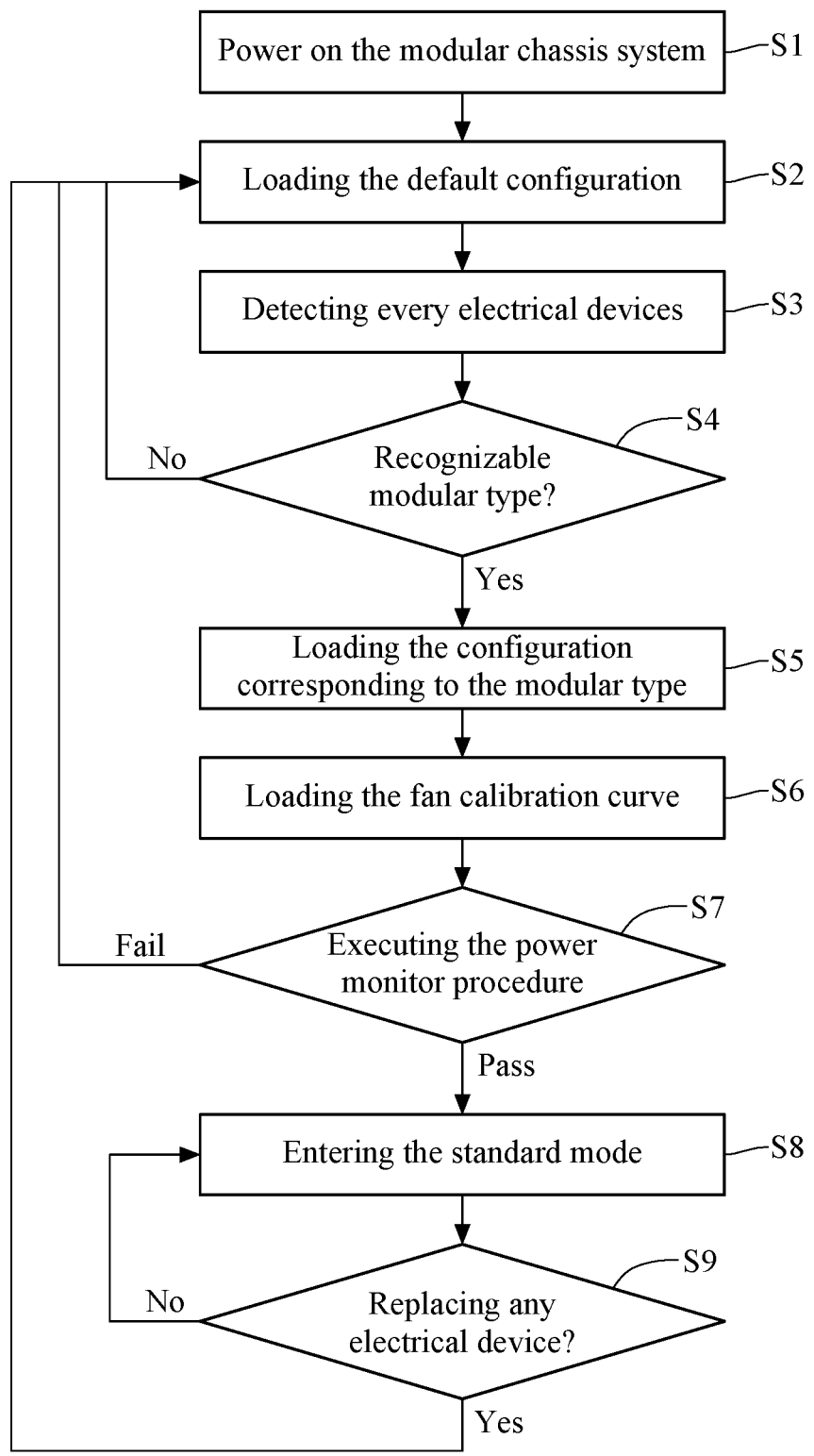
FIG. 3 is a flowchart of a method for operating the modular chassis system according to the embodiment of the present disclosure.

FIG. 3 is a flowchart illustrating a method for operating the modular chassis system 9 according to the embodiment of the present disclosure. The method is adapted to the aforementioned modular chassis system 9. The modular chassis system 9 is configured to install a plurality of electrical devices 2 and each of the electrical devices 2 respectively corresponds to a detecting pin 3 and a protecting chip 5.

Please refer to the step S1, "Power on the modular chassis system." Specifically, after the modular chassis system 9 has been installed all of the electrical devices 2, one can provide the electricity to boot the modular chassis system 9 through the bus cable 8.

Please refer to the step S2, "Loading the default configuration." In detail, after the bus cable 8 supplies the power to boot the modular chassis system 9, the microcontroller 4 assigns all the protecting chips 5 according to a default configuration. It should be noticed that the rated current value of the default configuration is greater than the rated current value of all other configurations. In addition, the default configuration also comprises the maximum speed setting of fan 61. The system configuration with the maximum overcurrent protection and the maximum fan speed ensures that the system is still protected when booting or when the electrical device 2 is subsequently replaced.

Please refer to the step S3, "Detecting every electrical device 2." Specifically, the microcontroller 4 on the power distribution board 1 detects the modular type of each electrical device 2 through the detection pins 3 electrically connected to each of the electrical devices 2. It should be noticed that, in practical, the microcontroller 4 can also get the modular type of each electrical device 2 by means of software setting.

Please refer to the step S4 shown in FIG. 3. For each electrical device 2, the microcontroller 4 determines whether it is a recognizable modular type. Practically, the step S4 adopts sequence detection for each electrical device 2. If the modular type is recognizable, such as the storage device 21 or the computing device 22 shown in FIG. 2, then executing the step S5. Otherwise, returning to step S2, the microcontroller 4 loads the default configuration. The default configuration is just the third configuration listed in the table above, and the parameter setting in the third configuration is used for the situation that the modular type of the electrical device 2 cannot be recognized by the system. In practice, the microcontroller 4 further comprises a timeout mechanism. Specifically, when the microcontroller 4 detects the unrecognizable electrical device 2 through the detecting pin 3, then the microcontroller 4 sets a maximum detection time. When the detecting time exceeds the maximum detection time, the detecting process jumps to the next electrical device 2, so that the system can prevent a deadlock on step S4 because of an unrecognizable electrical device 2. In addition, when an unrecognizable electrical device 2 is detected, the system also records this status in an error log.

Please refer to the step S5, "Loading the configuration corresponding to the modular type". Specifically, the microcontroller 4 sets the configuration according to different module types. For example, the storage device 21 is suitable for the first configuration, and the computing device 22 is suitable for the second configuration. The electrical device 2 different from the above two modular types is suitable for the third configuration. Each protecting chip 5 on the power distribution board 1 sets its own rated current value according to the configuration set by the microcontroller 4. For example, the rated current value of the storage device 21 is 100 amps, and the rated current value of the computing device 22 is 30 amps.

Please refer to the step S6, "Loading the fan calibration curve." Specifically, the microcontroller 4 on the power distribution board 1 finds the fan calibration curve corresponding to the configuration from the storage component 7, and applies to the corresponding fan 61 in the fan assembly 6. It should be stated once again that the correspondence of the various configurations, the rated current values and the fan calibration curves can optionally be stored with another storage component 7 or can be stored directly in the storage space of the microcontroller 4 itself, and this is not a limitation in the present disclosure.

Please refer to the step S7, "Executing the power monitoring procedure." Specifically, the modular chassis system 9 monitors based on multiple assigned rated current values and the fan calibration curves. In practical, the modular chassis system 9 executes a heavy load test to detect whether the overcurrent protection mechanism and the fan speed meet expectations or not. Moreover, the modular chassis system 9 detects whether the voltage is too high or too low when executing the heavy load test in step S7. As for the overcurrent protection, it is determined by the maximum current and the allowable inrush current of the electrical device 2. Said heavy load test continues for a period of time to confirm whether the configuration assigned in the step S5 is suitable for the electrical device 2 when the electrical device 2 is operating. For example, if the electrical device 2 initiates a power off protection due to a heavy load test in the step S7, it means that the previously assigned configuration is not suitable for the electrical device 2, thus returning to the step S2 to reload the default configuration, and then continues to execute steps S3 to S7. In other words, the power monitoring procedure described in the step S7 can prevent the detecting pins 3 from setting a wrong configuration to the electrical device 2 due to a misjudgment.

Please refer to the step S8. "Entering the standard mode." As described in the step S7, if all the electrical devices 2 of the modular chassis system 9 and all the fans 61 of the fan assembly 6 are in a normal operating state after the power monitoring procedure, the system can enter the standard mode. Otherwise, if any unsatisfactory state is found in the power monitoring procedure, then the modular chassis system 9 returns to the step S2 to restart the configuration assignment.

Please refer to the step S9, "Replacing any electrical device?" The microcontroller 4 still keeps detecting whether there is any change of the electrical device 2 through the detecting pin 3 or the software setting at any time during the standard working mode of the modular chassis system 9. For example, replace a certain storage device 21 with a computing device 22. If the microcontroller 4 detects that the electrical device 2 is replaced, then steps S2 to S7 are executed again. Otherwise, the modular chassis system 9 continues to operate in the standard mode as described in the step S8. In addition, it should be noticed that in this embodiment of the present disclosure, since the configuration assignment reference is considered from the perspective of a system management, all the electrical devices 2 installed in the modular chassis system 9 will be changed to the default configuration in step S2 when one or more electrical devices 2 are detected to be replaced.

To sum up, the power distribution board, the modular chassis system having said power distribution board and the method for operating the modular chassis system disclosed in the present disclosure propose a dynamic protection mechanism and a device of implementation said mechanism. The main purpose of the present disclosure is to dynamically configure the overcurrent protection settings, and instantly detect the modular types of every electrical device in the modular chassis system through a microcontroller and a plurality of detecting pins on the power distribution board, and allow protecting chip adjusts its own rated current value.

On the other hand, the fan is also adjusted to control the cooling airflow according to the configuration assigned by the microcontroller, and the correspondence between the configuration and the fan calibration curve is stored in the EEPROM, so that the microcontroller can load the fan calibration curve immediately. In addition, after the system is powered on, the microcontroller will first load the default configuration (a configuration with the maximum overcurrent protection and the maximum fan speed) before detecting the modular type of the electrical device, and then confirm all the modular types of the electrical devices through the detection pins in the system. As a result, the protection mechanism is loaded at the first time after booting, and the protection mechanism instantly adjusted in the subsequent power-on process is most suitable for each electrical device. Compared with the conventional power distribution board, there is only one fixed configuration mode, so that the electrical devices with lower loading current and lower fan rotation speed are also configured with maximum rated current value and maximum fan rotation speed, resulting in unnecessary power consumption. The modular chassis system disclosed in the present disclosure can always be protected in any combination of different kinds of electrical devices and reduce the extra power consumption caused by the fan.

What is claimed is:

1. A power distribution board for a modular chassis system, wherein the modular chassis system is configured to install a plurality of electrical devices, and the power distribution board comprises:
   a plurality of detecting pins configured to electrically connect to the plurality of electrical devices respectively, wherein each of the detecting pins is configured to detect a modular type of a respective one of the electrical devices;
   a microcontroller electrically connected to the plurality of detecting pins, wherein the microcontroller is configured to selectively assign one of a plurality of configurations according to the detected modular type; and
   a plurality of protecting circuits electrically connected to the microcontroller and configured to correspond to the plurality of electrical devices, wherein each of the protecting circuits is configured to assign a rated power value according to the assigned one of the configurations;
   wherein the microcontroller is configured to assign the protecting circuits according to a default configuration; and
   wherein the plurality of protecting circuits are configured to perform a power monitor procedure according to the assigned rated power values; the power monitoring procedure is a heavy-load test, when the heavy-load test is failed, the microcontroller re-assigns the plurality of protecting circuits according to the default configuration, determines the modular type of each of the electrical devices according each of the detecting pins, and assigns another one of the plurality of configurations according to each of the modular types, each of the protecting circuits assigns the rated power value according said another one of the assigned configurations, and the plurality of protecting circuits executes the power monitoring procedure according to the assigned rated power values; and the rated power value defined by the default configuration is greater than every rated power values defined in the plurality of configurations.

2. The power distribution board according to claim 1, wherein the plurality of configurations comprises a first configuration and a second configuration, and the rated power value defined in the first configuration is greater than the rated power value defined in the second configuration.

3. The power distribution board according to claim 1, further comprising a storage component electrically connected to the microcontroller, wherein the storage component is configured to store a corresponding relation of the modular types and the configurations.

4. The power distribution board according to claim 3, wherein the storage component is further configured to store another corresponding relation of the modular types and a plurality of fan calibration curves.

5. The power distribution board according to claim 3, wherein the storage component is ROM or EEPROM.

6. The power distribution board according to claim 1, wherein the microcontroller further comprises a storage space configured to store a corresponding relation of the modular types and the configurations.

7. A modular chassis system for installing a plurality of electrical devices comprising:
   a power distribution board comprising:
      a plurality of detecting pins configured to electrically connect to the plurality of electrical devices respectively, wherein each of the detecting pins is configured to detect a modular type of a respective one of the electrical devices;
      a microcontroller electrically connected to the plurality of detecting pins, wherein the microcontroller is configured to selectively assign one of a plurality of configurations according to the detected modular type; and
      a plurality of protecting circuits electrically connected to the microcontroller and configured to correspond to the plurality of electrical devices, wherein each of the protecting circuits is configured to assign a rated power value according to the assigned one of the configurations;
   a bus cable electrically connecting to the power distribution board, wherein the bus cable is configured to connect to an external power to provide an electricity to the modular chassis system; and
   a fan assembly electrically connecting to the microcontroller and having a plurality of fans, wherein each of the fans adjusts a fan speed according to the assigned one of the configurations;
   wherein the microcontroller is configured to assign the protecting circuits according to a default configuration; and
   wherein the plurality of protecting circuits are configured to perform a power monitor procedure according to the assigned rated power values; the power monitoring procedure is a heavy-load test, when the heavy-load test is failed, the microcontroller re-assigns the plurality of protecting circuits according to the default configuration, determines the modular type of each of the electrical devices according each of the detecting pins, and assigns another one of the plurality of configurations according to each of the modular types, each of the protecting circuits assigns the rated power value according said another one of the assigned configurations, and the plurality of protecting circuits executes the power monitoring procedure according to the assigned rated power values and the rated power value defined by the default configuration is greater than every rated power values defined in the plurality of configurations.

8. The modular chassis system according to claim 7, wherein the plurality of configurations comprises a first configuration and a second configuration, and the rated power value defined in the first configuration is greater than the rated power value defined in the second configuration.

9. The modular chassis system according to claim 7, further comprising a storage component electrically connected to the microcontroller, wherein the storage component is configured to store a corresponding relation of the modular types and the configurations.

10. The modular chassis system according to claim 9, wherein the storage component is further configured to store another corresponding relation of the modular types and a plurality of fan calibration curves, and each of the fans adjusts the fan speed according to the fan calibration curve.

11. The modular chassis system according to claim 9, wherein the storage component is ROM or EEPROM.

12. The modular chassis system according to claim 7, wherein the microcontroller further comprises a storage space configured to store a corresponding relation of the modular types and the configurations.

13. A method for operating a modular chassis system, wherein the modular chassis system is configured to install a plurality of electrical devices and each of the electrical devices corresponds to a detecting pin and a protecting circuit, and the method comprises:
providing a power to boot the modular chassis system by a bus cable;
after providing the power to boot the modular chassis system by the bus cable, assigning the plurality of protecting circuits according to a default configuration by a microcontroller;
determining a modular type of each of the electrical devices by a microcontroller according to each of the detecting pins;
assigning one of a plurality of configurations according to each of the modular types by the microcontroller;
assigning a rated power value according to the assigned configuration by each of the protecting circuits; and
executing a power monitoring procedure according to the assigned rated power values by the protecting circuits, wherein the power monitoring procedure is a heavy-load test, when the heavy-load test is failed, re-assigning the protecting circuits according to the default configuration, determining the modular type of each of the electrical devices by the microcontroller according each of the detecting pins; assigning another one of the plurality of configurations according to each of the modular types by the microcontroller; assigning the rated power value according said another one of the assigned configurations by each of the protecting circuits; and executing the power monitoring procedure according to the assigned rated power values by the protecting circuits; and the rated power value defined by the default configuration is greater than every rated power values defined in the plurality of configurations.

14. The method according to claim 13, before determining the modular type of each of the electrical devices by the microcontroller according to each of the detecting pins, further comprising determining whether each of the electrical devices has already installed in the modular chassis system according to each of the detecting pins by the microcontroller.

15. The method according to claim 13, after the modular chassis system passing the power monitoring procedure, determining whether the modular type of each of the electrical devices changing according to each of the detecting pins by the microcontroller, and re-assigning the protecting circuits by the microcontroller when detecting the change by the microcontroller.

16. The method according to claim 13, after providing the power to boot the modular chassis system by the bus cable, further comprising setting a fan assembly by the microcontroller according to the default configuration, wherein the fan assembly comprises a plurality of fans, and the default configuration is configured to drive each of the fans of the fan assembly to operate in a maximum rotation speed; after assigning said one of a plurality of configurations according to each of the modular types by the microcontroller, further comprising adjusting the rotation speed by each of the fans according to the assigned one of the configurations; and monitoring the rotation speed of each of the fans by the modular chassis system.

* * * * *